United States Patent
Yamauchi et al.

(10) Patent No.: US 10,416,007 B2
(45) Date of Patent: Sep. 17, 2019

(54) ENVIRONMENTAL SENSOR

(71) Applicant: OMRON Corporation, Kyoto-shi, Kyoto (JP)

(72) Inventors: Takanobu Yamauchi, Kyoto (JP); Naotsugu Ueda, Kusatsu (JP); Kayo Nakamura, Kusatsu (JP); Ryusuke Sakai, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 11 days.

(21) Appl. No.: 15/866,553

(22) Filed: Jan. 10, 2018

(65) Prior Publication Data
US 2018/0259376 A1 Sep. 13, 2018

(30) Foreign Application Priority Data
Mar. 13, 2017 (JP) .................................. 2017-047830

(51) Int. Cl.
| | |
|---|---|
| *G08B 25/14* | (2006.01) |
| *G08B 25/08* | (2006.01) |
| *G08B 25/10* | (2006.01) |
| *G08B 29/06* | (2006.01) |
| *G05B 23/02* | (2006.01) |
| *G01D 21/02* | (2006.01) |
| *B81B 7/00* | (2006.01) |

(Continued)

(52) U.S. Cl.
CPC .......... *G01D 21/02* (2013.01); *B81B 7/0058* (2013.01); *B81B 7/0087* (2013.01); *B81C 99/003* (2013.01); *G01L 9/0019* (2013.01); *G01L 9/125* (2013.01); *B81B 2201/02* (2013.01)

(58) Field of Classification Search
CPC ..................................................... G01D 21/02
See application file for complete search history.

(56) References Cited

U.S. PATENT DOCUMENTS 6,072,396 A * 6/2000 Gaukel .................. G16H 40/67
340/573.4
9,642,529 B1 * 5/2017 Siddiqui .............. A61B 5/0008
(Continued)

FOREIGN PATENT DOCUMENTS

JP 2006-300734 A 11/2006
JP 2008-64616 A 3/2008
(Continued)

OTHER PUBLICATIONS

Extended European search report dated Jul. 5, 2018 in the counterpart European patent application.

*Primary Examiner* — Joseph H Feild
*Assistant Examiner* — Pameshanand Mahase
(74) *Attorney, Agent, or Firm* — Metrolex IP Law Group, PLLC

(57) ABSTRACT

An environmental sensor including sensor elements to measure multiple physical quantities associated with a surrounding environment, and includes a state determination unit that determines whether the environmental sensor is in a first state in which the sensor is fixed at a predetermined installation location or in a second state in which the sensor is away from an installation location, and an operation switch unit that switches an operation of each sensor element that measures the physical quantities based on whether a state determined by the determination unit is the first state or the second state.

17 Claims, 12 Drawing Sheets

(51) Int. Cl.
  *G01L 9/12* (2006.01)
  *G01L 9/00* (2006.01)
  *B81C 99/00* (2010.01)

(56) References Cited

U.S. PATENT DOCUMENTS

| | | | |
|---|---|---|---|
| 2013/0190903 A1* | 7/2013 | Balakrishnan | A61B 5/7246 |
| | | | 700/91 |
| 2014/0221855 A1* | 8/2014 | McCaffrey | A61B 5/486 |
| | | | 600/508 |
| 2015/0258415 A1* | 9/2015 | Trivedi | H04M 1/72522 |
| | | | 700/91 |
| 2015/0269824 A1* | 9/2015 | Zhang | G08B 21/0438 |
| | | | 340/539.12 |

FOREIGN PATENT DOCUMENTS

| | | |
|---|---|---|
| WO | 2014187261 A1 | 11/2014 |
| WO | 2016131618 A1 | 8/2016 |

* cited by examiner

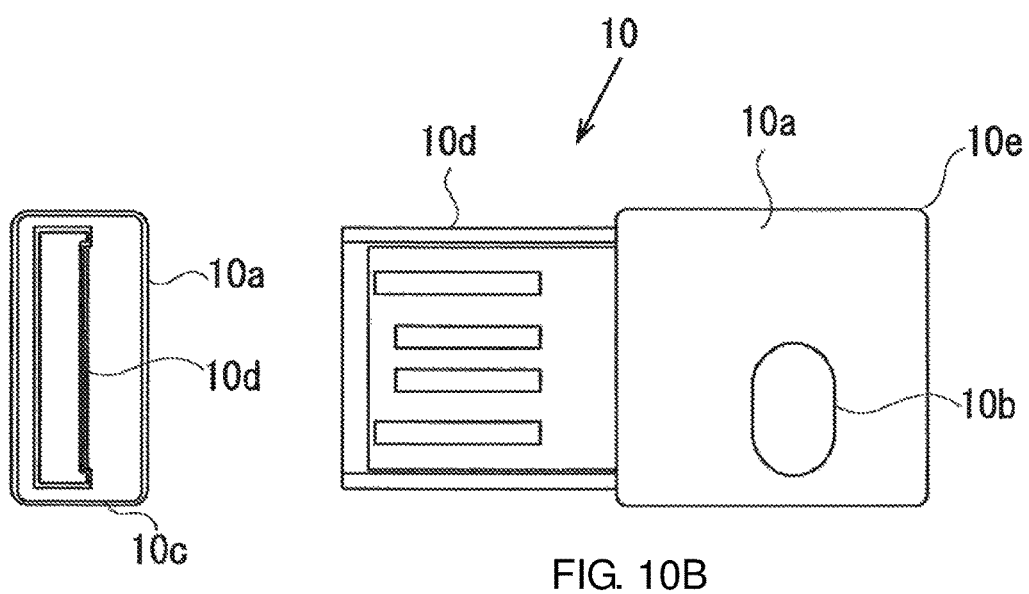
FIG. 10A
FIG. 10B
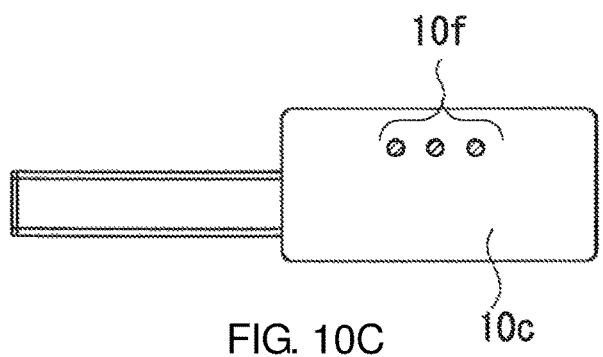
FIG. 10C

ENVIRONMENTAL SENSOR

CROSS REFERENCE TO RELATED APPLICATIONS

This application claims priority from prior Japanese Patent Application No. 2017-047830 filed with the Japan Patent Office on Mar. 13, 2017, the entire contents of which are incorporated herein by reference.

FIELD

The disclosure relates to an environmental sensor that measures a plurality of physical quantities associated with a surrounding environment.

BACKGROUND

Devices including various measurement units for obtaining biometric information about a user or environmental information about the surrounding environment have been developed (e.g., Patent Literature 1). A device described in Patent Literature 1 includes a plurality of measurement units and a notification unit. Also, various sensor elements have been developed to detect physical quantities including temperature, humidity, atmospheric pressure, and a light level. Micro electro mechanical systems (MEMS) sensor elements (hereafter also referred to as MEMS sensors) using MEMS technology, which are compact and consume low power, now receive attention. Such compact and low power MEMS sensor elements may be incorporated in a single device, enabling the design of a sensor including multiple different sensor elements.

A sensor with this structure can detect physical quantities associated with, for example, an office environment or a living space, and can obtain, for example, various items of information such as biometric information and environmental information, in addition to energy-related information such as electric power. Such information can then be used to support multidirectional analysis and use of information.

A sensor including multiple sensor elements has been typically installed at a fixed location for continuously measuring the environment for a fixed duration. However, compact sensors developed recently are often carried away from their installation locations and are used at different locations. For such sensors, items of target information to be obtained and suitable methods for obtaining such information may differ between when they are fixed at installation locations and when they are away from the installation locations. Sensors responding to such requests have not been achieved yet.

CITATION LIST

Patent Literature

Patent Literature 1: Japanese Unexamined Patent Application Publication No. 2006-300734
Patent Literature 2: Japanese Unexamined Patent Application Publication No. 2008-64616

SUMMARY

Technical Problem

In response to the above situation, one or more aspects are directed to a technique for optimizing the operation of an environmental sensor used in a fixed state in which the sensor is fixed at an installation location and used in an unfixed state in which the sensor is away from the installation location to increase the use mode variations of the environmental sensor and enhance its convenience.

Solution to Problem

In response to the above issue, one aspect provides an environmental sensor that determines whether the environmental sensor is in a fixed state in which the sensor is fixed at an installation location or in an unfixed state in which the sensor is away from the installation location.

More specifically, the environmental sensor for measuring a plurality of physical quantities associated with a surrounding environment includes a plurality of sensor elements, and a state determination unit that determines whether the environmental sensor is in a first state in which the environmental sensor is fixed at a predetermined installation location or in a second state in which the environmental sensor is away from the installation location.

This environmental sensor determines whether being fixed at its installation location or being away from the installation location. The environmental sensor can thus change the physical quantities to be measured or measurement methods to be used in accordance with its state. This structure increases the use mode variations of the environmental sensor and enhances its convenience.

In the above aspect, the environmental sensor may further include an operation switch unit that switches an operation of each of the sensor elements that measures the physical quantities based on whether a state determined by the determination unit is the first state or the second state.

This environmental sensor changes the physical quantities to be measured or measurement methods to be used between the fixed state in which the sensor is fixed at the installation location and the unfixed state in which the sensor is away from the installation location. The environmental sensor can thus continue measurement as appropriate for the purpose in either state. This structure increases the use mode variations of the environmental sensor and enhances its convenience.

In the above aspect, the state determination unit may determine whether the environmental sensor is in the first state or in the second state based on at least one of the physical quantities. This environmental sensor determines whether being fixed at its installation location or being away from the installation location with its inherent function, without adding new functions. This structure increases the use mode variations of the environmental sensor and enhances its convenience at low cost.

In the above aspect, the sensor elements may include an acceleration sensor element that measures an acceleration applied to the environmental sensor. The state determination unit may determine whether the environmental sensor is in the first state or in the second state based on the acceleration measured by the acceleration sensor element. When moved away from the installation location, the environmental sensor may receive a greater acceleration than when fixed at the installation location. The environmental sensor according to the above aspect can thus detect its moving state using the physical quantity that changes most greatly when the sensor is moved. This structure detects the state of the environmental sensor more accurately.

In the above aspect, the sensor elements may include an atmospheric pressure sensor element that measures an atmospheric pressure around the environmental sensor. The state determination unit may determine a vertical position of the environmental sensor based on the atmospheric pressure measured by the atmospheric pressure sensor element. The state determination unit may determine that the environmental sensor is in the first state when the determined vertical position of the environmental sensor indicates a value representing a vertical position of the installation location, and determines that the environmental sensor is in the second state when the determined vertical position of the environmental sensor deviates from the value representing the vertical position of the installation location.

When the environmental sensor installed at a high installation location carried is away from the installation location, the environmental sensor is likely to be at a lower location, for which a higher atmospheric pressure will be measured. In contrast, when the environmental sensor installed at a low installation location is carried away from the installation location, the environmental sensor is likely to be at a higher location, for which a lower atmospheric pressure will be measured. The environmental sensor determines its vertical position based on the atmospheric pressure measured by the atmospheric pressure sensor element, and determines the state of the environmental sensor being either the first state when the determined vertical position of the environmental sensor indicates a value representing the vertical position of the installation location, or the second state when the determined vertical position of the environmental sensor deviates from the value representing the vertical position of the installation location. This information is used to more easily determine that the environmental sensor is away from the installation location and is being moved.

In the above aspect, the sensor elements may include an illuminance sensor element that measures an illuminance of light incident on the environmental sensor. The state determination unit may determine whether the environmental sensor is in the first state or in the second state based on the illuminance measured by the illuminance sensor element.

When the environmental sensor is carried away from its installation location during daytime and is being moved in a user's pocket or bag, light incident on the environmental sensor may be blocked and a lower illuminance may be measured by the illuminance sensor. The illuminance remaining lower for a predetermined duration indicates that the environmental sensor is being moved. This information is used by the environmental sensor according to the aspect to more easily determine that the sensor is away from the installation location and is being moved.

In the above aspect, the environmental sensor may further include a connection unit electrically connectable to a mobile device. The state determination unit may determine that the environmental sensor is in the second state when the state determination unit detects that the environmental sensor is connected to the mobile device through the connection unit. More specifically, the environmental sensor may be connected to a mobile device, such as a smartphone, when the environmental sensor is carried away from its installation location and is being moved. This may allow the environmental sensor to have a specific function when the sensor is being moved. In this case, the environmental sensor may detect that the environmental sensor is connected to a mobile device, and determine that the environmental sensor is being moved. This environmental sensor determines whether the environmental sensor is being moved in a more reliable manner based on the mode of the environmental sensor while being moved.

In the above aspect, the operation switch unit may stop at least one of the sensor elements in the second state. The environmental sensor can stop the operation of its sensor elements with less uses while being moved. This structure reduces power consumption and saves the battery. Stopping the operation of the sensor elements includes switching the sensors having a sleep mode to the sleep mode, in addition to entirely stopping supplying power to the sensor elements. Stopping the operation of the sensor elements further includes simply stopping obtaining data from these sensor elements while continuously supplying power to the sensors. The same applies to the aspects described below.

In the above aspect, the operation switch unit may stop the acceleration sensor element in the first state, and activate the acceleration sensor element in the second state. This structure allows the acceleration sensor element to be mainly used to measure accelerated motion of the environmental sensor while the sensor is being moved unless the environmental sensor may be used to measure an earthquake. This allows the environmental sensor to be used as an exercise counter while being moved, thus increasing the use mode variations of the environmental sensor.

In the above aspect, the sensor elements may include an acceleration sensor element that measures an acceleration applied to the environmental sensor. The operation switch unit may cause the acceleration sensor element to obtain data at shorter intervals in the second state than in the first state. More specifically, the environmental sensor fixed at its installation location may mostly be used to measure an acceleration for detecting an earthquake, whereas the environmental sensor while being moved may mostly be used to measure an acceleration for measuring activities. The environmental sensor according to the aspect thus obtains, when in a fixed state at its installation location, acceleration data at intervals optimized for detecting an earthquake, whereas when being moved, obtains acceleration data at intervals optimized for measuring activities. This enables optimization of parameters for acceleration measurement used in the environmental sensor when the sensor is in a fixed state at its installation location and when the sensor is being moved. This improves the performance of the environmental sensor in accordance with the purpose in either state.

In the above aspect, the environmental sensor may alert a user when the state determination unit determines that the environmental sensor unit is in a state other than both the first state and the second state. More specifically, when the environmental sensor is away from its installation location and is being moved, for example, the user may forget to fix the environmental sensor at its installation location after returning to near the installation location. In this case, the environmental sensor may alert the user when determining that the sensor is in a state other than both the first state and the second state. This prevents unintended use of the environmental sensor, and thus eliminates wasted time and energy.

In the above aspect, the environmental sensor may further include a fixing unit fixable at the installation location, and a movable unit fixable to the fixing unit in the first state, and removable from the fixing unit in the second state. The sensor elements may include an illuminance sensor element that measures an illuminance of light incident on the environmental sensor. The illuminance sensor element among the sensor elements may be placed in the fixing unit.

When fixed at its installation location, the environmental sensor may often be used to monitor turning on or off of the light continuously at the location. The environmental sensor according to the aspect thus enables continuous monitoring of the on or off state of the light when the environmental sensor is moved and used. More specifically, the movable unit in the environmental sensor is removed from the fixing unit, which is fixed at the installation location, and the movable unit is moved away, whereas the fixing unit including the illuminance sensor element is left to monitor the on or off state of the light continuously. The sensor elements included in the environmental sensor are appropriately allocated to the fixing unit and the movable unit. More specifically, the sensor elements that are highly likely to obtain information in the first state are allocated to the fixing unit, whereas the sensor elements that are highly likely to obtain information in the second state are allocated to the movable unit. This structure increases the convenience of the environmental sensor in the first state and the second state further.

In the above aspect, the environmental sensor may further include a fixing unit fixable at the installation location, and a movable unit fixable to the fixing unit in the first state, and removable from the fixing unit in the second state. The fixing unit may include a positional information storage unit that stores positional information for the fixing unit. This structure allows the sensor elements included in the fixing unit to obtain environmental information continuously at the installation location when the movable unit is replaced.

In the above aspect, the environmental sensor may further include a fixing unit fixable at the installation location, and a movable unit fixable to the fixing unit in the first state, and removable from the fixing unit in the second state. The movable unit may receive a key for a space including the installation location. When the environmental sensor is installed at an elderly person's house, for example, the movable unit may be combined with a key for the house. This allows the elderly person to remember to bring the movable unit together with the key when he or she goes out, and enables the measurement of the activity of the elderly person in a more reliable manner.

The environmental sensor according to the aspect includes the movable unit combined with a key is fixed to the fixing unit when the elderly person stays home, and thus can obtain environmental information around the elderly person based on changes in the atmospheric pressure or illumination. When going out, the elderly person will bring the key. The sensor elements included in the movable unit can remotely inform that the elderly person is out of the home, or provide positional information and information about the physical activity states of the elderly person. In this manner, the environmental sensor according to the aspect is usable for watching over the elderly. In this case, it may be preferable that the movable unit be fixed to the fixing unit with the key having its distal portion received in the casing of the fixing unit.

In the above aspect, the environmental sensor may further include a fixing unit fixable at the installation location, a second movable unit, and a sensor element unit fixable to the fixing unit in the first state, and fixable to the second movable unit in the second state. At least one of the sensor elements may be placed in the sensor element unit. This structure allows the sensor element unit to include sensor elements that are used to measure physical quantities both in the first state and in the second state. The remaining other sensor elements may be included in the fixing unit. When the sensor is moved, a minimum number of sensor elements are activated, thus reducing power consumption. In moving the sensor, the second movable unit and the sensor element unit may be connected to each other to provide a higher function while the sensor is being moved.

The above aspects for solving the issues may be used in combination.

Advantageous Effects

The environmental sensor according to one or more aspects optimizes the operation of an environmental sensor when used in a fixed state in which the environmental sensor is fixed at an installation location and when in an unfixed state in which the sensor is away from the installation location. This structure increases the use mode variations of the environmental sensor and enhances its convenience.

BRIEF DESCRIPTION OF THE DRAWINGS

FIGS. 10A to 10C are external three views illustrating an environmental sensor unit according to an eighth embodiment.

DETAILED DESCRIPTION

Embodiments will now be described in detail by way of example with reference to the drawings.

First Embodiment

Figure 1:
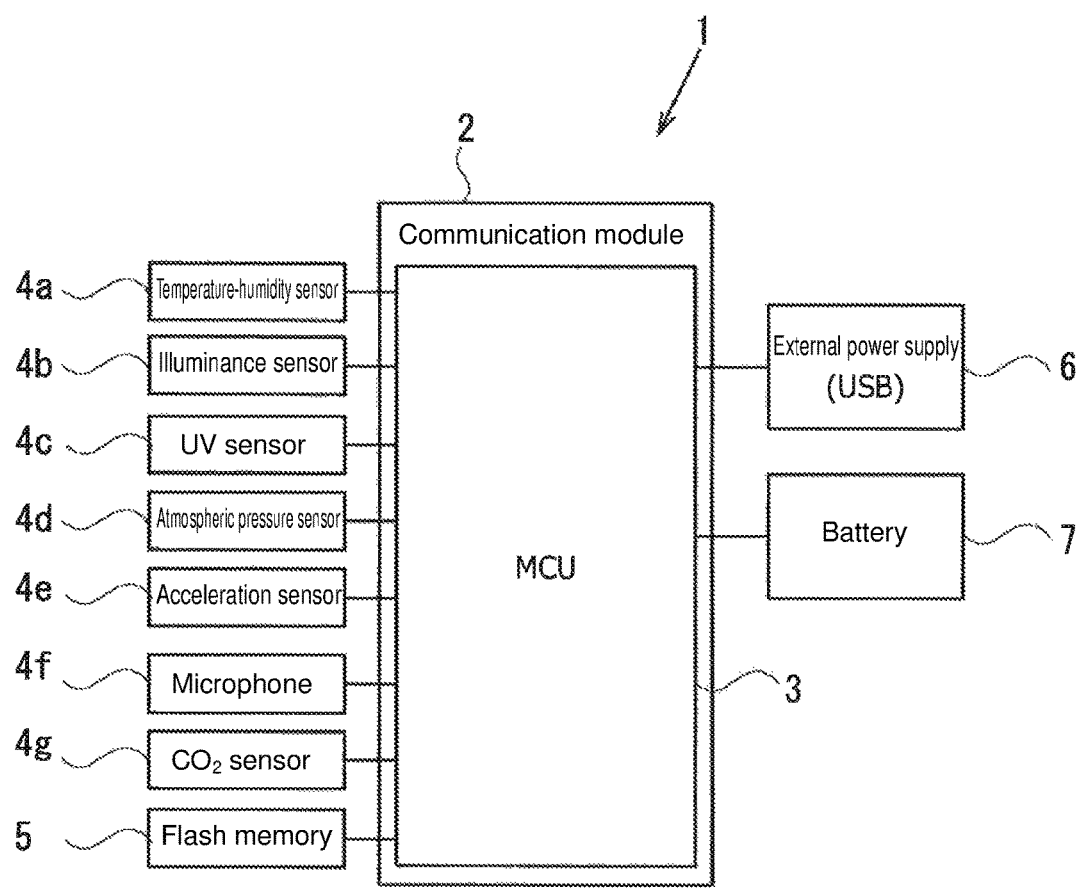
FIG. 1 is a block diagram illustrating an environmental sensor unit according to an embodiment.

FIG. 1 is a block diagram of an environmental sensor unit 1, which is an environmental sensor according to an embodiment. The environmental sensor unit 1 includes a plurality of sensors 4a to 4g as sensor elements, a flash memory 5, which temporarily stores measured data, a communication module 2, which allows communication with an external device, and a micro controller unit (MCU) 3, which is a processing unit. More specifically, the sensors 4a to 4g include a temperature-humidity sensor 4a, an illuminance sensor 4b, an ultraviolet (UV) sensor 4c, an atmospheric pressure (absolute pressure) sensor 4d, an acceleration sensor 4e, a microphone (acoustic sensor) 4f, and a $CO_2$ sensor 4g. These sensors can continuously obtain environmental data about the environment surrounding the environmental sensor unit 1. The communication module 2 communicates with a remote controller (not shown), such as a smartphone, to transmit environmental data detected by the sensors 4a to 4g to the remote controller and to receive control signals for controlling the environmental sensor unit 1 from the remote controller.

The flash memory 5 can temporarily store data measured by the sensors 4a to 4g to prevent loss of various items of environmental data when the communication with the communication module 2 is disabled. The MCU 3 controls the sensors 4a to 4g, the flash memory 5, and the communication module 2. The environmental sensor unit 1 includes a connecting terminal (e.g., a universal serial bus or a USB terminal) for connection to an external power supply 6, and a housing for a battery 7. The environmental sensor unit 1 can thus be driven both by the external power supply 6 and by the battery 7.

Figure 2A:
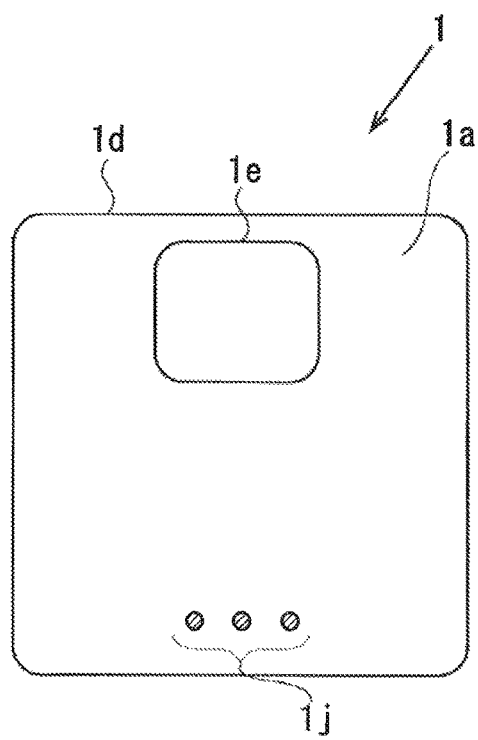
FIGS. 2A to 2C are external three views illustrating an environmental sensor unit according to an embodiment.
Figure 2B:
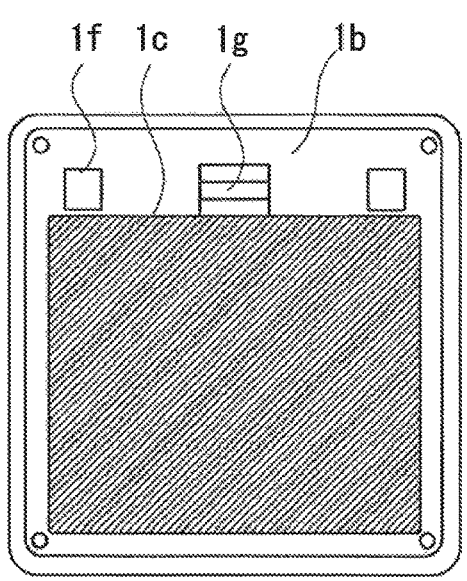
Figure 2C:
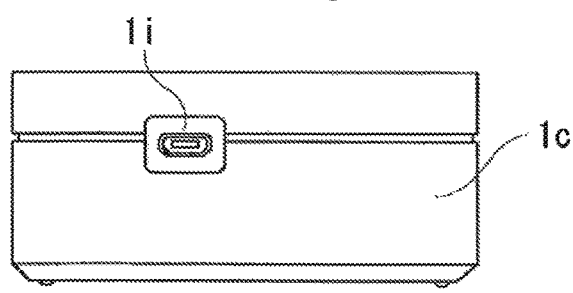

FIGS. 2A to 2C are external views of the environmental sensor unit 1 according to an embodiment. FIG. 2A is a front view of the environmental sensor unit 1 viewed from its front surface 1a, FIG. 2B is a back view of the environmental sensor unit 1 viewed from its back surface 1b, and FIG. 2C is a side view of the environmental sensor unit 1 viewed from its one side surface 1c. The environmental sensor unit 1 according to an embodiment includes a rectangular parallelepiped casing 1d, which is substantially square when viewed from the front surface 1a, and is substantially rectangular when viewed from the side surface 1c. The components shown in FIG. 1 (excluding the external power supply 6) are contained in the casing 1d.

The environmental sensor unit 1 is placed on the floor with its back surface 1b on the floor surface, or is hung on the wall with its back surface 1b facing the wall surface and thus with its front surface 1a exposed to the outside environment. The front surface 1a has a lighting window 1e for collecting visible light and UV light. The lighting window 1e is formed from a material that transmits visible light and UV light. The intensity of the visible light passing through the lighting window 1e is detected by the illuminance sensor 4b, and the intensity of the UV light passing through the lighting window 1e is detected by the UV sensor 4c. This enables measurement of the illuminance and the UV light. The front surface 1a further has vents 1j, which allow the outside air to flow into the environmental sensor unit 1. The target physical quantities are measured by the temperature-humidity sensor 4a, the atmospheric pressure sensor 4d, the microphone 4f, and the $CO_2$ sensor 4g using the outside air around the environmental sensor unit 1 flowing through the vents 1j into the environmental sensor unit 1.

The environmental sensor unit 1 has, on its back surface 1b, a lock tab 1g for opening and closing a back lid on the back surface 1b, recesses 1f that are to be engaged with wall hooks (not shown) to allow mounting on the wall, and a magnet 1h that allows installation on a piece of furniture formed from a ferromagnetic material. The back lid (not shown) is arranged below the magnet 1h, and can internally receive a battery mountable for a battery-powered operation. Also, the side surface 1c has a connector 1i for connection to the external power supply 6. The environmental sensor unit 1 installed at a location where environmental information is to be obtained enables continuous measurement of information including temperature and humidity, illuminance, UV light intensity, atmospheric pressure (absolute pressure), acceleration under vibrations or other factors, noise, and $CO_2$.

As described above, this type of environmental sensor unit 1 is designed to be installed at a location exposed to the environment in which environmental information is continuously obtained (corresponding to a first state). However, the environmental sensor unit 1 may be used after being moved away from the installation location (corresponding to a second state). For example, the environmental sensor unit 1 may be used at a location different from the above installation location to obtain environmental information at the different location, or may be carried by a user who is moving to obtain information about the environment to which the moving user is exposed or to obtain information about the user's activities while the user is moving.

When the environmental sensor unit 1 is being moved, target data to be measured or measurement methods to be used may differ from the target data or the measurement methods used in the environmental sensor unit 1 in a fixed state at the installation location. In response to this, the environmental sensor unit 1 according to an embodiment determines whether the environmental sensor unit 1 is fixed at the installation location or is being moved based on environmental data that is normally obtained by the environmental sensor unit 1, and then performs control in accordance with the determined state.

Figure 3:
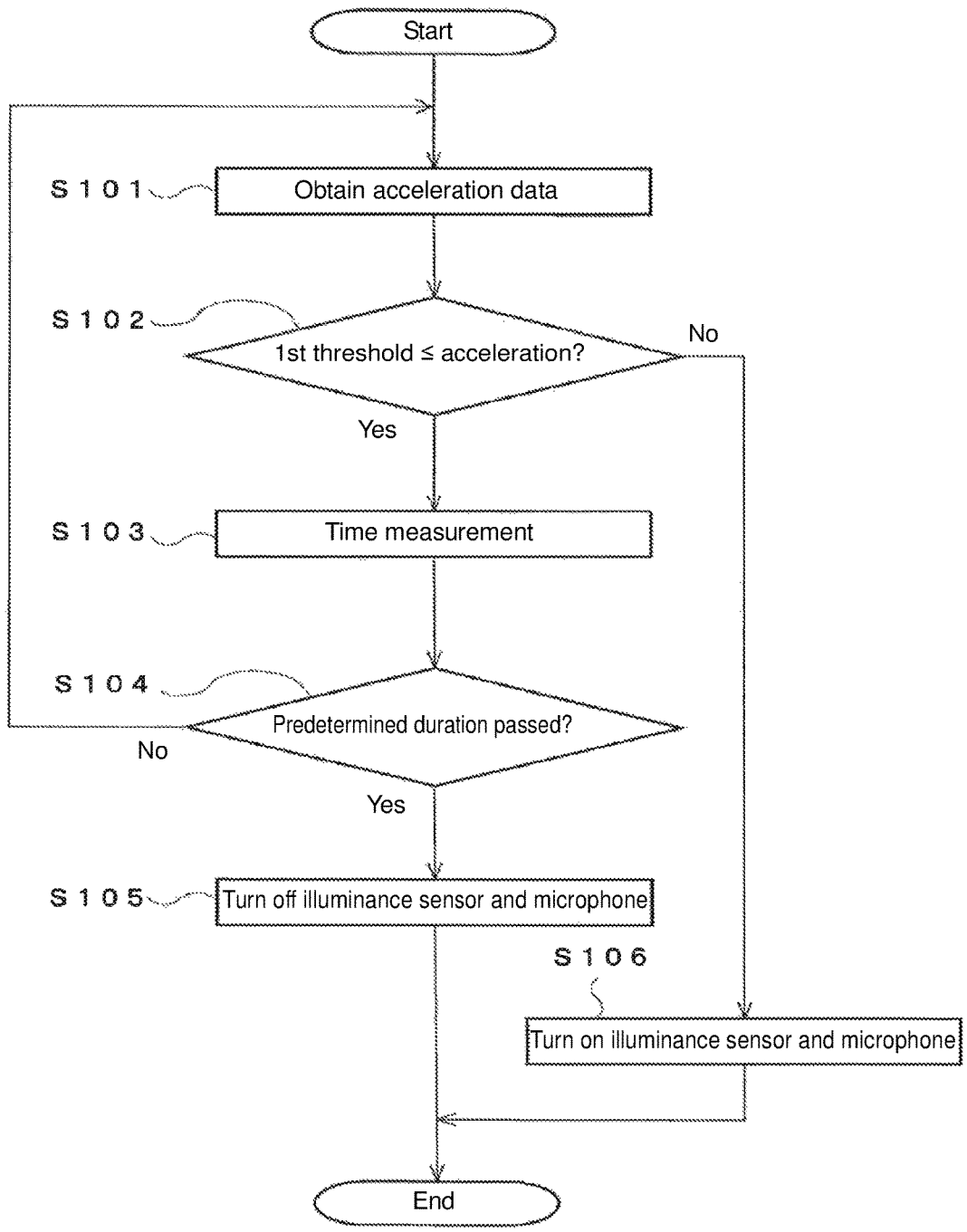
FIG. 3 is a flowchart illustrating a control procedure for a moving detection routine according to a first embodiment.

FIG. 3 is a flowchart showing a moving detection routine 1 according to an embodiment. This routine is a program stored in a memory (not shown) of a memory control unit (MCU) 3, and is executed repeatedly by a processor (not shown) included in the MCU 3 at predetermined intervals.

When this routine is started, acceleration data is first obtained by the acceleration sensor 4e in S101. After the processing in step S101 is complete, the processing advances to S102. In S102, the processor determines whether the obtained acceleration value is greater than or equal to a predetermined first threshold. This processing is to detect an increase in the acceleration measured under the acceleration applied while the environmental sensor unit 1 is being moved. The first threshold may be set to the lower limit acceleration that is experimentally determined by measuring the acceleration applied to the environmental sensor unit 1 that accelerates together with the moving user.

When the obtained acceleration value is greater than or equal to the first threshold in S102, the processing advances to S103. When the obtained acceleration value is less than the first threshold, the processor determines that the environmental sensor unit 1 is fixed at its installation location at that time. The processing advances to S106.

In S103, time is measured. More specifically, when the acceleration value is greater than or equal to the first threshold for the first time in S102, the time measurement is started in S103. When the acceleration value remains greater than or equal to the first threshold in S102, the time measurement continues in S103. After the processing in step S103 is complete, the processing advances to S104.

In S104, the processor determines whether a predetermined duration has passed after the first determination resulting in the acceleration value greater than or equal to the first threshold. When the predetermined duration has yet to be passed, the processing in S101 to S103 is repeated. When the predetermined duration is determined to have passed in S104, the processor determines that the acceleration value remaining greater than or equal to the first threshold is not caused by a temporary phenomenon such as an earthquake, but is caused by a user who has carried away the environmental sensor unit 1 from the installation location and is being moved. The processing then advances to S105.

In S105, the MCU 3 turns off the illuminance sensor 4b and the microphone 4f. More specifically, when the predetermined duration is determined to have passed for the first time in S104, the illuminance sensor 4b and the microphone 4f are turned off in S105. When the predetermined duration is successively determined to have passed in S104, the illuminance sensor 4b and the microphone 4f are maintained to be off in S105. In this manner, the illuminance sensor 4b and the microphone 4f having less need of operation during moving are turned off to reduce power consumption.

In S106, the MCU 3 turns on the illuminance sensor 4b and the microphone 4f. More specifically, when the acceleration value is less than the first threshold for the first time in S102, the illuminance sensor 4b and the microphone 4f are turned on in S106. When the acceleration value remains less than the first threshold in S102, the illuminance sensor 4b and the microphone 4f are maintained to be on in S106. When the processing in S105 or S106 is complete, the routine ends.

As described above, the processor determines whether the environmental sensor unit 1 is fixed at the installation location or is being moved based on the acceleration values measured by the environmental sensor unit 1. When the environmental sensor unit 1 is fixed at the installation location, the illuminance sensor 4b and the microphone 4f are turned on to fully obtain environmental information. When the environmental sensor unit 1 is being moved, the illuminance sensor 4b and the microphone 4f are turned off to focus on reducing power consumption.

As described above, when fixed at the installation location, the environmental sensor unit 1 can be powered from the external power supply, and thus focuses on obtaining more items of environmental data. When being moved, the environmental sensor unit 1 is battery-powered, and can focus on saving the battery. In other words, the environmental sensor unit 1 can optimize the control in accordance with its use state. In an embodiment, the MCU 3 performing the processing in S101 to S104 functions as a state determination unit. The MCU 3 performing the processing in S105 and S106 functions as an operation switch unit.

Second Embodiment

A second embodiment will now be described. In the example described in an embodiment, the environmental sensor unit determines whether the environmental sensor unit is fixed at the installation location or is being moved based on atmospheric pressure data measured by the environmental sensor unit.

Figure 4:
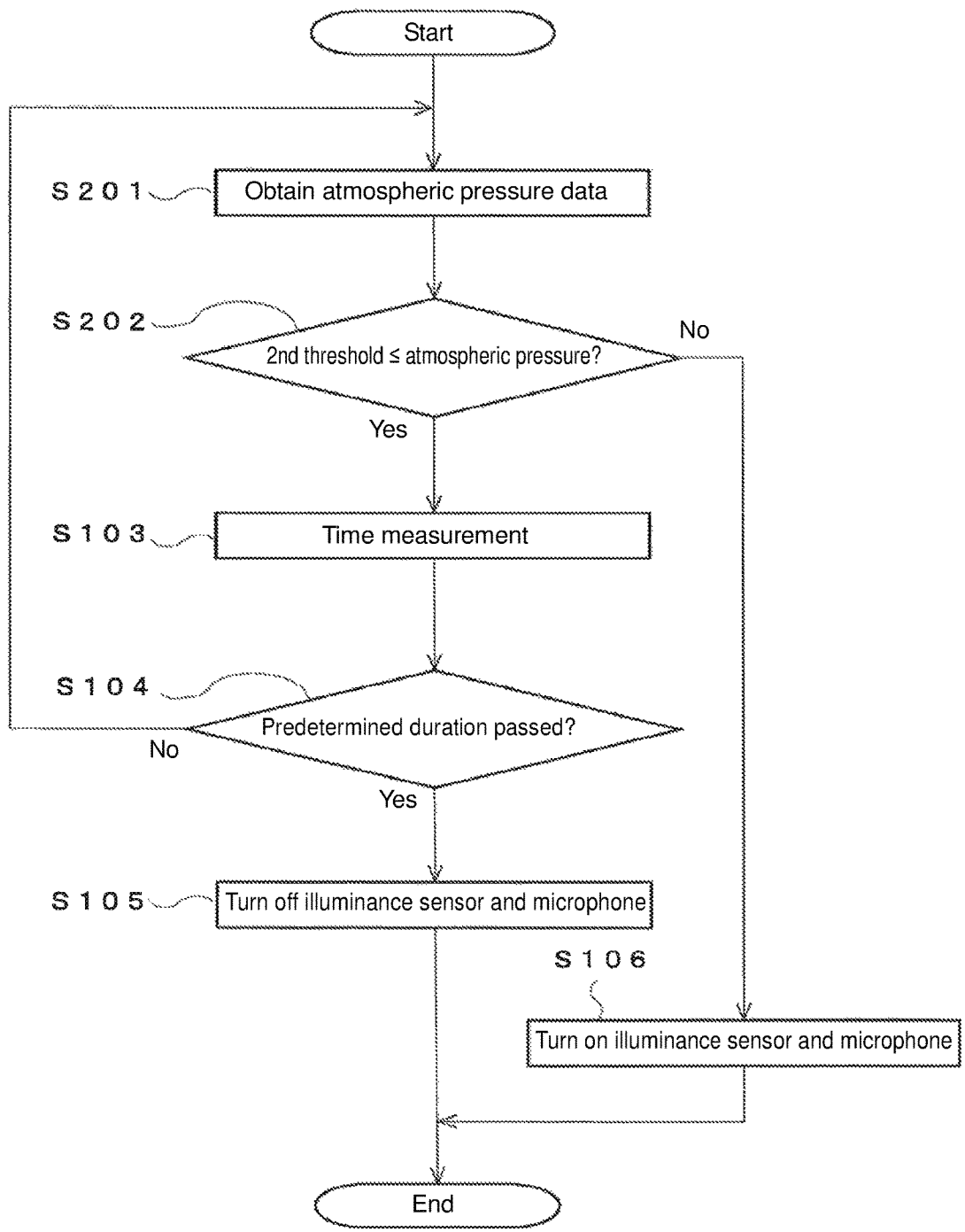
FIG. 4 is a flowchart illustrating a control procedure for a moving detection routine 2 according to a second embodiment.

FIG. 4 is a flowchart showing a moving detection routine 2 according to an embodiment. This routine is also a program stored in the memory in the MCU 3, and is executed repeatedly by the processor included in the MCU 3 at predetermined intervals.

When this routine is started, atmospheric pressure data is first obtained by the atmospheric pressure sensor 4d in S201. After the processing in step S201 is complete, the processing advances to S202. In S202, the processor determines whether the obtained atmospheric pressure data is greater than or equal to a predetermined second threshold. The environmental sensor unit 1 according to an embodiment is designed to be installed at, for example, a relatively high location, such as a high place in a room. In other words, the processing in S202 is to detect an increase in atmospheric pressure applied to the environmental sensor unit 1 when the unit is moved from the high installation location to a lower location. The second threshold may be set to the lower limit atmospheric pressure that is experimentally determined by measuring the atmospheric pressure applied to the environmental sensor unit 1 when moved away from the installation location.

When the obtained atmospheric pressure value is greater than or equal to the second threshold in S202, the processing advances to S103. When the obtained atmospheric pressure value is less than the second threshold, the processor determines that the environmental sensor unit 1 is not moved away from its installation location. The processing then advances to S106. The processing in S103 to S106 is equivalent to the processing described in a first embodiment, and will not be described.

In an embodiment, as described above, the processor determines whether the environmental sensor unit 1 is fixed at the installation location or is being moved based on the atmospheric pressure values measured by the atmospheric pressure sensor 4d in the environmental sensor unit 1. In other words, the processor determines that the environmental sensor unit 1 is being moved when the environmental sensor unit 1 is moved from its predetermined higher installation location to a lower location and is maintained at the location for a predetermined duration. When the environmental sensor unit 1 is fixed at the installation location, the illuminance sensor 4b and the microphone 4f are turned on to continuously obtain more items of environmental information. When the environmental sensor unit 1 is being moved, the illuminance sensor 4b and the microphone 4f are turned off to focus on saving the battery life.

As described above, when fixed at the installation location, the environmental sensor unit 1 can be powered from the external power supply, and thus focuses on obtaining environmental data. When being moved, the environmental sensor unit 1 is battery-powered, and can focus on saving the battery. The environmental sensor unit 1 can thus optimize the control in accordance with its use state.

In an embodiment, the environmental sensor unit 1 is designed to be installed at a relatively high location (e.g., a high place on a room wall that can be reached by a person with his or her hand). However, the environmental sensor unit 1 may be installed at a relatively low location (e.g., a low place on a room wall that can be touched by a person squatting down). In that case, the processor may determine whether the atmospheric pressure obtained by the atmospheric pressure sensor 4d is less than or equal to the predetermined second threshold in S202. In an embodiment, the MCU 3 performing the processing in S201, S202, S103, and S104 functions as the state determination unit. The MCU 3 performing the processing in S105 and S106 functions as the operation switch unit.

Third Embodiment

A third embodiment will now be described. In the example described in an embodiment, the environmental sensor unit determines whether the environmental sensor unit is fixed at the installation location or is being moved based on acceleration data and atmospheric pressure data measured by the environmental sensor unit. In an embodiment as well, the environmental sensor unit is designed to be installed at a relatively high installation location.

Figure 5:
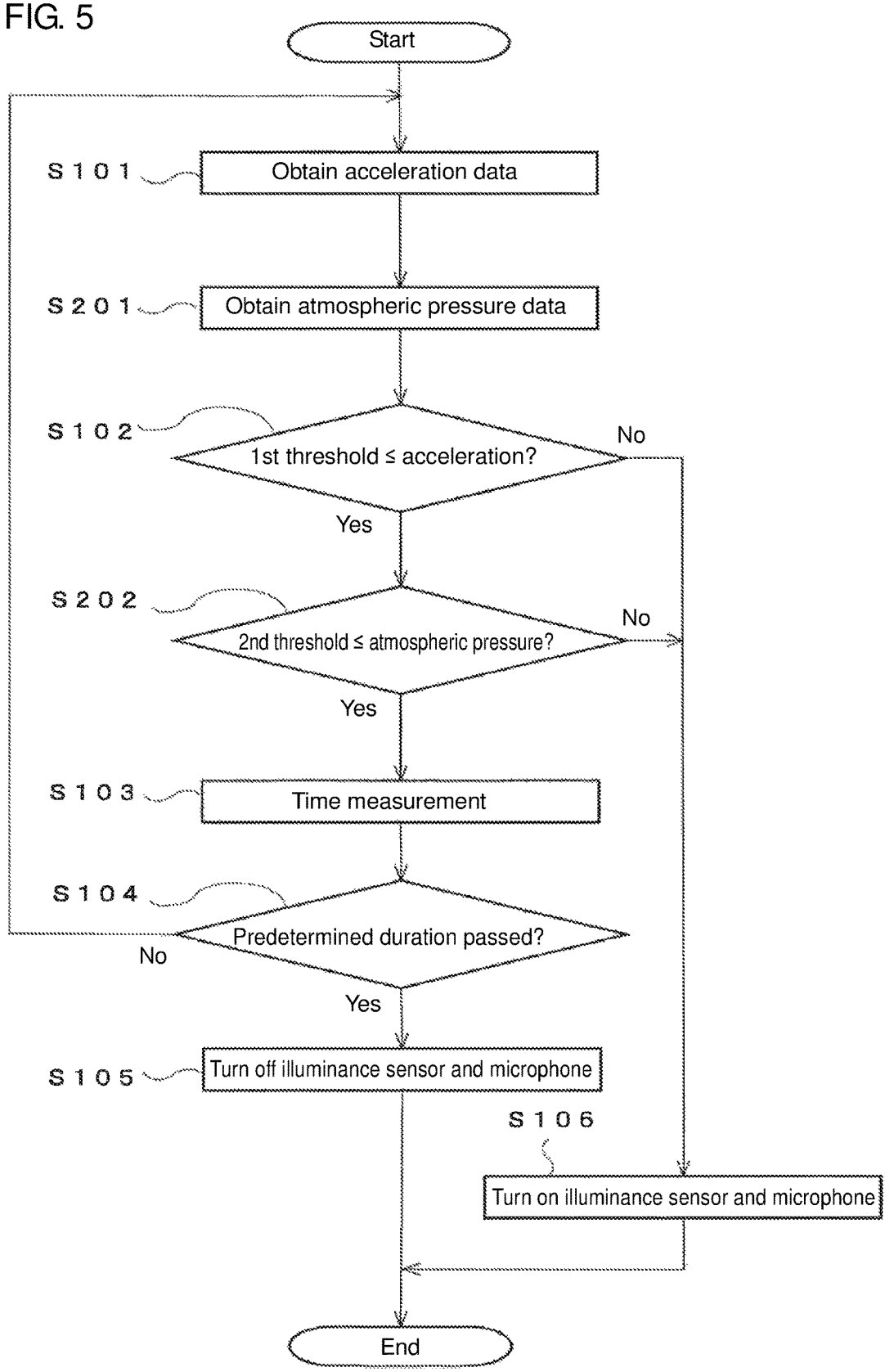
FIG. 5 is a flowchart illustrating a control procedure for a moving detection routine 3 according to a third embodiment.

FIG. 5 is a flowchart showing a moving detection routine 3 according to an embodiment. This routine is also a program stored in the memory in the MCU 3, and is executed repeatedly by the processor included in the MCU 3 at predetermined intervals.

When this routine is started, acceleration data is first obtained by the acceleration sensor 4e in S101. After the processing in step S101 is complete, the processing advances to S201. In S201, atmospheric pressure data is obtained by the atmospheric pressure sensor 4d. After the processing is complete in step S201, the processing advances to S102. In S102, the processor determines whether the obtained acceleration value is greater than or equal to a predetermined first threshold. When the obtained acceleration value is greater than or equal to the first threshold in S102, the processing advances to 202. When the obtained acceleration value is less than the first threshold, the processor determines that the environmental sensor unit 1 is fixed at its installation location at that time. The processing then advances to S106.

In S202, the processor determines whether the obtained atmospheric pressure value is greater than or equal to a predetermined second threshold. When the obtained atmospheric pressure value is greater than or equal to the second threshold in S202, the processing advances to S103. When the obtained atmospheric pressure value is less than the second threshold, the processor determines that the environmental sensor unit 1 is fixed at its installation location at that time. The processing then advances to S106. The processing in S103 to S106 is equivalent to the processing described in a first embodiment, and will not be described.

In an embodiment, as described above, the processor determines whether the environmental sensor unit 1 is fixed at the installation location or is being moved based on the acceleration values and the atmospheric pressure values measured by the environmental sensor unit 1. More specifically, the processor determines that the environmental sensor unit 1 is being moved when the acceleration value obtained by the acceleration sensor 4e remains greater than or equal to the first threshold, and the atmospheric pressure value obtained by the atmospheric pressure sensor 4d remains greater than or equal to the second threshold for a predetermined duration. Under these conditions being satisfied, the environmental sensor unit 1 has probably been moved away from its higher installation location to a lower location, and also probably is being moved at a certain speed. When the environmental sensor unit 1 is fixed at the installation location, the illuminance sensor 4b and the microphone 4f are turned on to continuously obtain more items of environmental information. When the environmental sensor unit 1 is being moved, the illuminance sensor 4b and the microphone 4f are turned off to focus on saving the battery life.

As described above, when fixed at the installation location, the environmental sensor unit 1 can be powered from the external power supply, and thus focuses on obtaining environmental data. When being moved, the environmental sensor unit 1 is battery-powered, and can focus on saving the battery. The environmental sensor unit 1 can thus optimize the control in accordance with its use state. In an embodiment, the MCU 3 performing the processing in S101, S201, S102, S202, S103, and S104 functions as the state determination unit. The MCU 3 performing the processing in S105 and S106 functions as the operation switch unit.

Fourth Embodiment

A fourth embodiment will now be described. In the example described in an embodiment, the environmental sensor unit determines whether the environmental sensor unit is fixed at the installation location or is being moved based on acceleration data and illuminance data measured by the environmental sensor unit.

Figure 6:
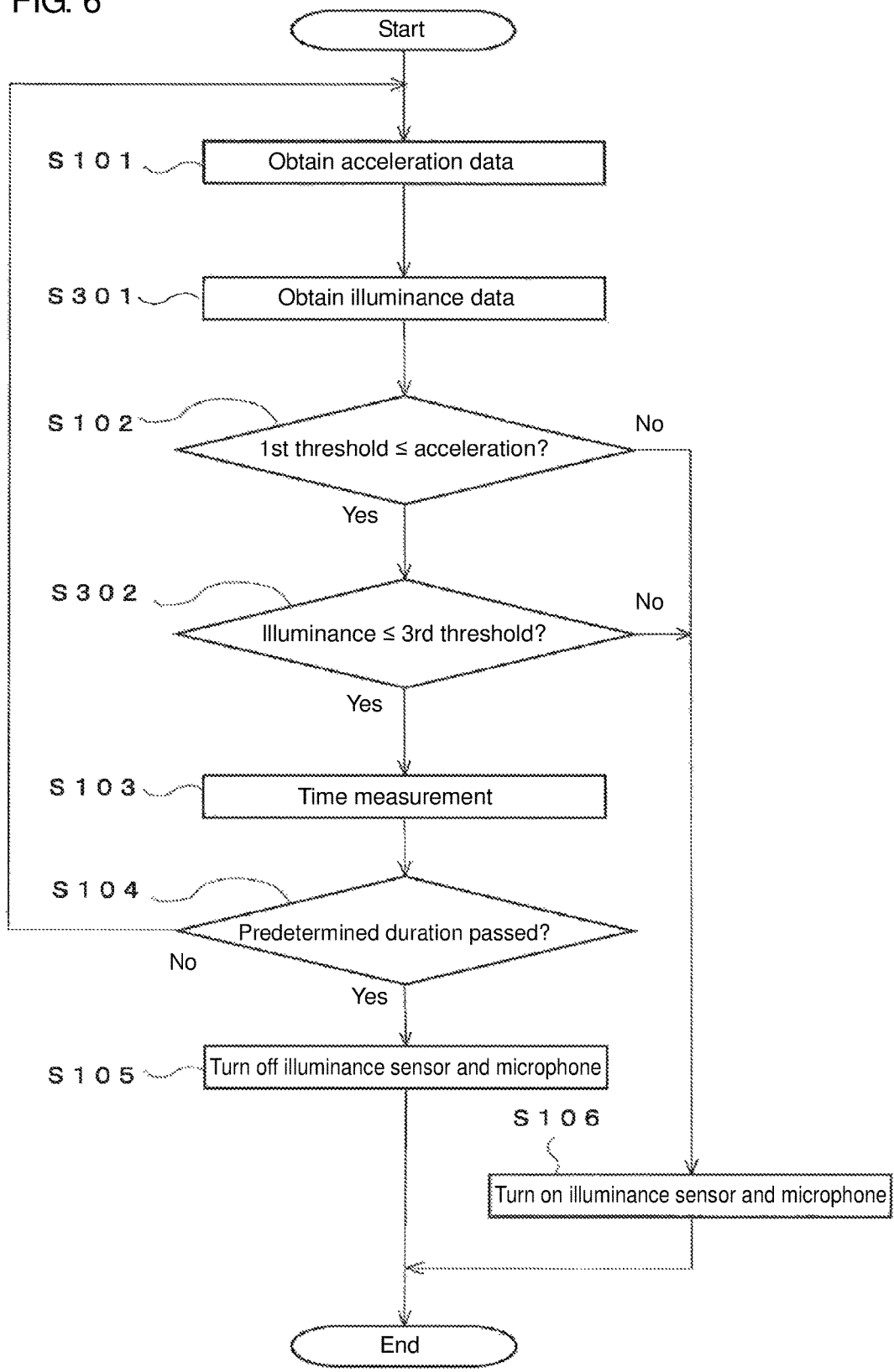
FIG. 6 is a flowchart illustrating a control procedure for a moving detection routine 4 according to a forth embodiment.

FIG. 6 is a flowchart showing a moving detection routine 4 according to an embodiment. This routine is also a program stored in the memory in the MCU 3, and is executed repeatedly by the processor included in the MCU 3 at predetermined intervals.

When this routine is started, acceleration data is first obtained by the acceleration sensor 4e in S101. After the processing in step S101 is complete, the processing advances to S301. In S301, illuminance data is obtained by the illuminance sensor 4b. After the processing in step S301 is complete, the processing advances to S102. In S102, the processor determines whether the obtained acceleration value is greater than or equal to a predetermined first threshold. When the obtained acceleration value is greater than or equal to the first threshold in S102, the processing advances to S302. When the obtained acceleration value is less than the first threshold, the processor determines that the environmental sensor unit 1 is fixed at its installation location at that time. The processing then advances to S106.

In S302, the processor determines whether the obtained illuminance value is less than or equal to a predetermined third threshold. When the obtained illuminance value is less than or equal to the third threshold in S302, the processing advances to S103. When the obtained illuminance value is greater than the third threshold, the processor determines that the environmental sensor unit 1 is fixed at its installation location at that time. The processing then advances to S106. The processing in S103 to S106 is equivalent to the processing described in a first embodiment, and will not be described.

In an embodiment, as described above, the processor determines whether the environmental sensor unit 1 is fixed at the installation location or is being moved based on the acceleration values and the illuminance values measured by the environmental sensor unit 1. More specifically, the processor determines that the environmental sensor unit 1 is being moved when the acceleration value remains greater than or equal to the first threshold, and the illuminance value remains less than or equal to the third threshold for a predetermined duration. Under these conditions being satisfied, the environmental sensor unit 1 is probably being moved at a certain speed, and is also probably placed in a dark space and is being carried in, for example, a bag. When the environmental sensor unit 1 is fixed at the installation location, the illuminance sensor 4b and the microphone 4f are turned on to continuously obtain more items of environmental information. When the environmental sensor unit 1 is being moved, the illuminance sensor 4b and the microphone 4f are turned off to focus on saving the battery life.

As described above as well, when fixed at the installation location, the environmental sensor unit 1 can be powered from the external power supply, and thus focuses on obtaining environmental data. When being moved, the environmental sensor unit 1 is battery-powered, and can focus on saving the battery. The environmental sensor unit 1 can thus optimize the control in accordance with its use state. In an embodiment, the MCU 3 performing the processing in S101, S301, S102, S302, S103, and S104 functions as the state determination unit. The MCU 3 performing the processing in S105 and S106 functions as the operation switch unit.

Fifth Embodiment

A fifth embodiment will now be described. In the example described in an embodiment, the environmental sensor unit determines whether the environmental sensor unit is fixed at the installation location or is being moved based on a signal indicating that the environmental sensor unit is connected to another mobile terminal, such as a smartphone. The environmental sensor unit in an embodiment is designed to be connected to, when being moved, a mobile terminal, such as a smartphone, to receive power and to obtain environmental information during moving.

Figure 7:
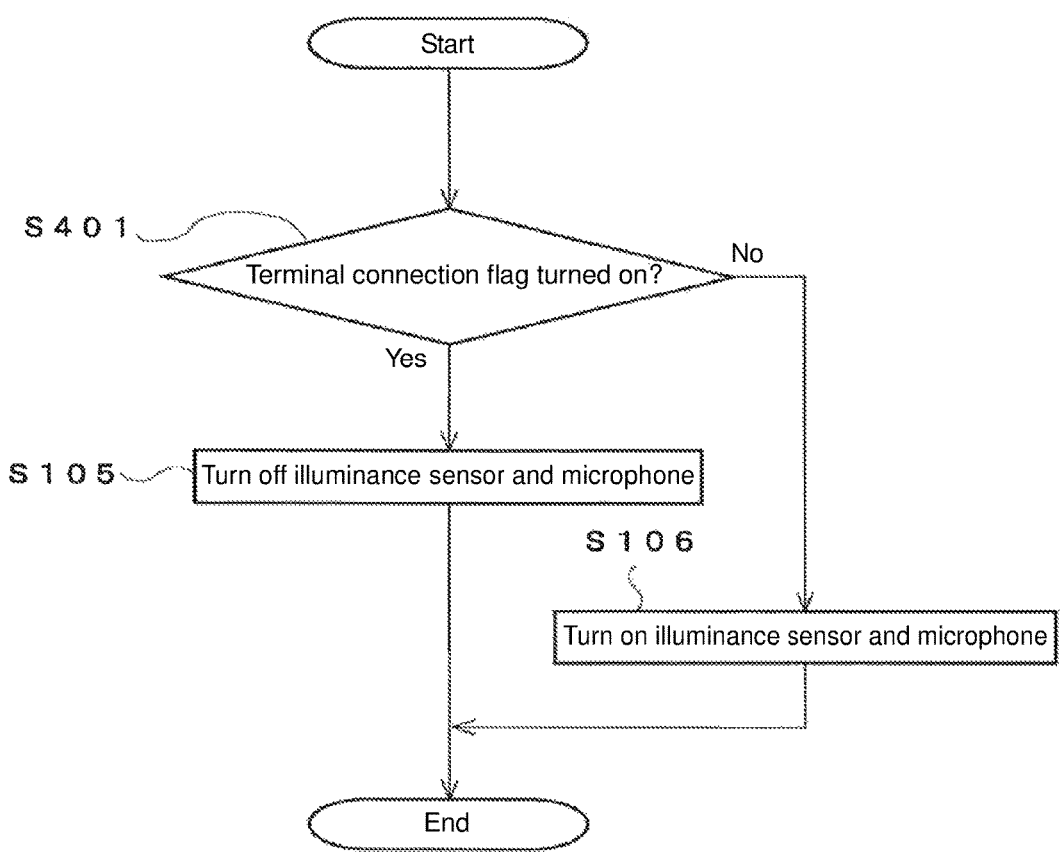
FIG. 7 is a flowchart illustrating a control procedure for a moving detection routine 5 according to a fifth embodiment.

FIG. 7 is a flowchart showing a moving detection routine 5 according to an embodiment. This routine is also a program stored in the memory in the MCU 3, and is executed repeatedly by the processor included in the MCU 3 at predetermined intervals.

When this routine is started, the processor first determines whether a terminal connection flag is turned on in S401. More specifically, the processor reads and checks the value of the terminal connection flag, which is turned on when the environmental sensor unit 1 is moved away from its installation location and is connected to a mobile terminal. When the terminal connection flag is turned on in S401, the processor determines that the environmental sensor unit 1 is connected to a mobile terminal and is being moved. The processing then advances to S105. When the terminal connection flag is not turned on and is maintained to be off, the processor determines that the environmental sensor unit 1 is fixed at its installation location at that time. The processing then advances to S106. The processing in S105 and S106 is equivalent to the processing described in a first embodiment, and will not be described.

In an embodiment, as described above, the processor determines whether the environmental sensor unit 1 is fixed at the installation location or is being moved based on the value of the terminal connection flag detected by the environmental sensor unit 1. More specifically, the processor determines that the environmental sensor unit 1 is connected to a mobile terminal and is being moved when the terminal connection flag is turned on, whereas the processor determines that the environmental sensor unit 1 is fixed at the installation location when the terminal connection flag is maintained to be off. When the environmental sensor unit 1 is fixed at the installation location, the illuminance sensor 4b and the microphone 4f are turned on to continuously obtain more items of environmental information. When the environmental sensor unit 1 is being moved, the illuminance sensor 4b and the microphone 4f are turned off to focus on saving the battery life.

As described above as well, when fixed at the installation location, the environmental sensor unit 1 can be powered from the external power supply, and thus focuses on obtaining environmental data. When being moved, the environmental sensor unit 1 is battery-powered, and can focus on saving the battery. The environmental sensor unit 1 can thus optimize the control in accordance with its use state. In an embodiment, the MCU 3 performing the processing in S401 functions as the state determination unit. The MCU 3 performing the processing in S105 and S106 functions as the operation switch unit. In an embodiment, a connecter (e.g., a USB) that connects the environmental sensor unit 1 to a mobile terminal functions as a connection unit of an embodiment.

Sixth Embodiment

A sixth embodiment will now be described. In the example described in an embodiment, the environmental sensor unit determines whether the environmental sensor unit is fixed at the installation location or is being moved based on atmospheric pressure data measured by the environmental sensor unit. In this embodiment, the acceleration sensor is turned on when the environmental sensor unit is being moved. In an embodiment, the environmental sensor unit does is not designed to measure an earthquake.

Figure 8:
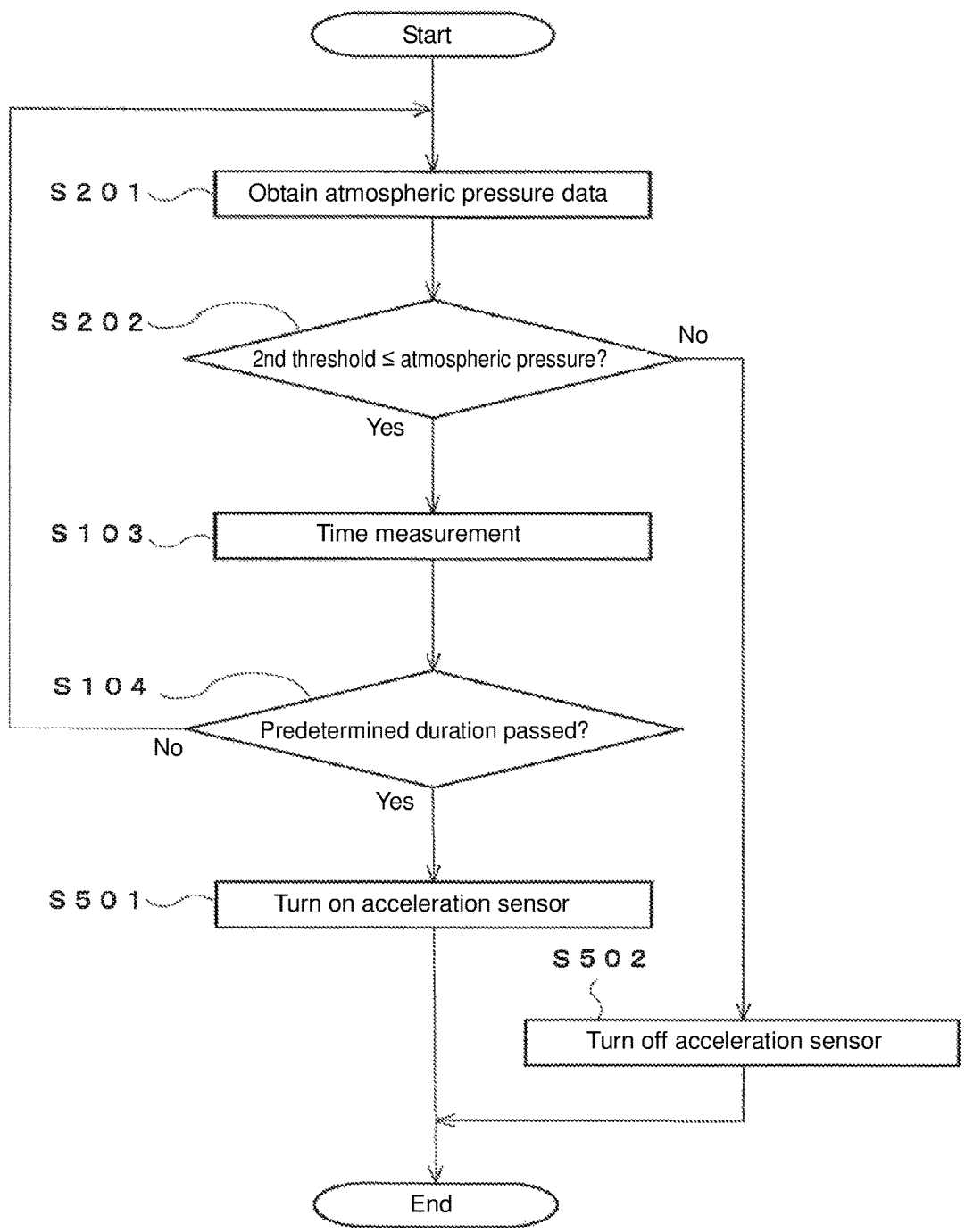
FIG. 8 is a flowchart illustrating a control procedure for a moving detection routine 6 according to a sixth embodiment.

FIG. 8 is a flowchart showing a moving detection routine 6 according to an embodiment. This routine is also a program stored in the memory in the MCU 3, and is executed repeatedly by the processor included in the MCU 3 at predetermined intervals.

The processing in S201, S202, S103, and S104 in this routine is equivalent to the processing in the moving detection routine 2 described in a second embodiment, and will not be described. An embodiment differs from the moving detection routine 2 in the manner described below. In an embodiment, when the obtained atmospheric pressure value is less than a second threshold in S202, the processor determines that the environmental sensor unit 1 is fixed at the installation location. The processing then advances to S502. When the obtained atmospheric pressure value remains greater than or equal to the second threshold for a predetermined duration in S104, the processor determines that the environmental sensor unit 1 is moved away from its installation location and is being moved. The processing then advances to S501.

In S501, the MCU 3 turns on the acceleration sensor 4e. More specifically, when the predetermined duration is determined to have passed for the first time in S104, the acceleration sensor 4e is turned on in S501. When the predetermined duration is successively determined to have passed in S104, the acceleration sensor 4e is maintained to be on in S501. In this manner, the environmental sensor unit 1 turns on its acceleration sensor 4e particularly when being moved, and thus can be used as an exercise counter.

In S502, the MCU 3 turns off the acceleration sensor 4e. More specifically, when the obtained atmospheric pressure value is determined to be less than the second threshold for the first time in S202, the acceleration sensor 4e is turned off in S502. When the atmospheric pressure value remains less than the second threshold in S202, the acceleration sensor 4e is maintained to be off in S502. In this manner, the acceleration sensor 4e in the environmental sensor unit 1 is to be turned off when the unit is fixed at the installation location. The environmental sensor unit 1 stops obtaining acceleration data. When the processing in S501 or S502 is complete, the routine ends.

In an embodiment, as described above, the processor determines whether the environmental sensor unit 1 is fixed at the installation location or is being moved based on the atmospheric pressure values measured by the atmospheric pressure sensor 4d in the environmental sensor unit 1. In other words, the processor determines that the environmental sensor unit 1 is being moved when the environmental sensor unit 1 is moved from its predetermined higher installation location to a lower location and is maintained at the location for a predetermined duration. When the environmental sensor unit 1 is fixed at the installation location, the acceleration sensor 4e is turned off. When the environmental sensor unit 1 is being moved, the acceleration sensor 4e is turned on to function as an exercise counter.

In this manner, when fixed at the installation location, the environmental sensor unit 1 focuses on collecting items of environmental information other than information about an earthquake. When being moved, the environmental sensor unit 1 focuses on collecting items of information to function as an exercise counter. This structure increases the use mode variations of the environmental sensor unit 1 and enhances its convenience. In an embodiment, the MCU 3 performing the processing in S201, S202, S103, and S104 functions as the state determination unit. The MCU 3 performing the processing in S501 and S502 functions as the operation switch unit.

In the example described in an embodiment, the environmental sensor unit 1 is used as an exercise counter when moved away from its installation location. Conversely from the above, an exercise counter may be installed at an installation location to function as the environmental sensor unit 1. In this case, an exercise counter including at least the acceleration sensor 4e is connected to an installation unit including other sensor elements to form the environmental sensor unit 1. In other embodiments, an exercise counter including a plurality of sensor elements, including the acceleration sensor 4e, is connected to an installation unit including no sensor elements and simply having power supply capability to form the environmental sensor unit 1. In this manner, a user having an existing exercise counter or a more functional exercise counter including more sensor elements than the existing exercise counter may use the installation unit to allow the exercise counter to, for example, measure environmental information in a room.

Seventh Embodiment

A seventh embodiment will now be described. In the example described in an embodiment, the environmental sensor unit determines whether the environmental sensor unit is fixed at the installation location or is being moved based on atmospheric pressure data measured by the environmental sensor unit. In an embodiment, the acceleration sensor obtains acceleration data at different intervals depending on when the environmental sensor unit is fixed at the installation location and when the environmental sensor unit is being moved.

Figure 9:
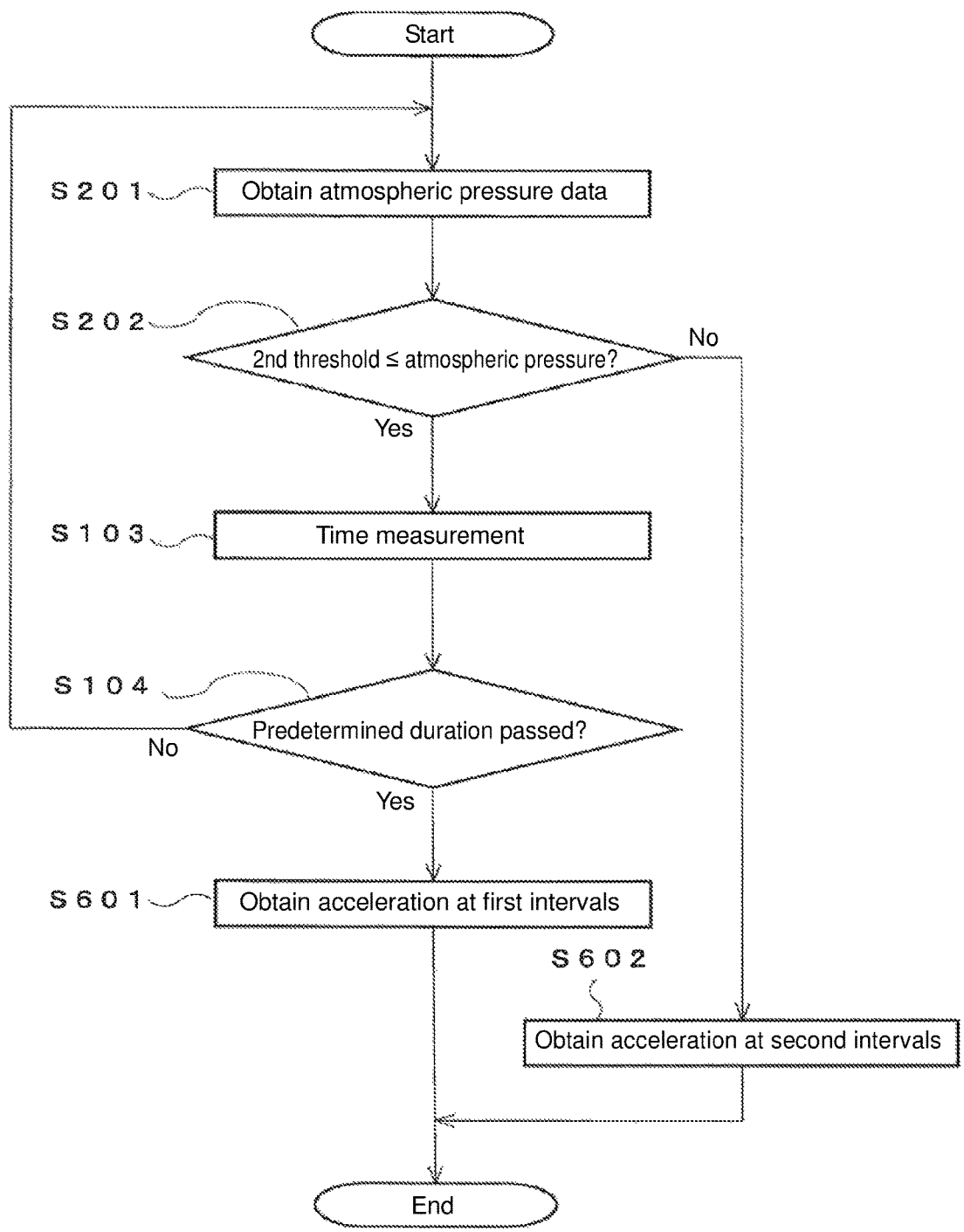
FIG. 9 is a flowchart illustrating a control procedure for a moving detection routine 7 according to a seventh embodiment.

FIG. 9 is a flowchart showing a moving detection routine 7 according to an embodiment. This routine is also a program stored in the memory in the MCU 3, and is executed repeatedly by the processor included in the MCU 3 at predetermined intervals.

The processing in S201, S202, S103, and S104 in this routine is equivalent to the processing in the moving detection routine 2 described in a second embodiment, and will not be described. In an embodiment, when the obtained atmospheric pressure value is less than a second threshold in S202, the processor determines that the environmental sensor unit 1 is not being moved away from its installation location. The processing then advances to S602. When the obtained atmospheric pressure value remains greater than or equal to the second threshold for a predetermined duration in S104, the processor determines that the environmental sensor unit 1 is moved away from its installation location and is being moved. The processing then advances to S601.

In S601, the MCU 3 causes the acceleration sensor 4e to obtain the acceleration data at shorter intervals, which are first intervals. More specifically, when the predetermined duration is determined to have passed for the first time in S104, the MCU 3 causes the acceleration sensor 4e to obtain the acceleration data at the first intervals in S601. When the predetermined duration is successively determined to have passed in S104, the acceleration sensor 4e is maintained to obtain the acceleration data at the first intervals in S601. In this manner, the acceleration sensor 4e being moved can obtain the acceleration data at shorter intervals, and thus can be used as an exercise counter to record the user's activity states in a more accurate manner.

In S602, the MCU 3 causes the acceleration sensor 4e to obtain the acceleration data at longer intervals, which are second intervals. More specifically, when the atmospheric pressure value is greater than or equal to the second threshold for the first time in S202, the MCU 3 causes the acceleration sensor 4e to obtain the acceleration data at the second intervals in S602. When the atmospheric pressure value remains greater than or equal to the second threshold in S202, the acceleration sensor 4e is maintained to obtain the acceleration data at the second intervals in S602. In this manner, the acceleration sensor 4e obtains the acceleration data at longer intervals when fixed at the installation location at which the environmental sensor unit 1 is less likely to receive an acceleration. This reduces power consumption. When the processing in S601 or S602 is complete, the routine ends.

In an embodiment, as described above, the processor determines whether the environmental sensor unit 1 is fixed at the installation location or is being moved based on the atmospheric pressure values measured by the environmental sensor unit 1. In other words, the processor determines that the environmental sensor unit 1 is being moved when the environmental sensor unit 1 is moved from its predetermined higher installation location to a lower location and is maintained at the location for a predetermined duration. When the environmental sensor unit 1 is fixed at the installation location, the processor causes the acceleration sensor 4e to obtain the acceleration data at longer intervals. When the environmental sensor unit 1 is being moved, the processor causes the acceleration sensor 4e to obtain the acceleration data at shorter intervals.

In this manner, when fixed at the installation location, the environmental sensor unit 1 can reduce power consumption for obtaining environmental information. When being moved, the environmental sensor unit 1 can improve measurement accuracy as an exercise counter. In an embodiment, the MCU 3 performing the processing in S201, S202, S103, and S104 functions as the state determination unit. The MCU 3 performing the processing in S601 and S602 functions as the operation switch unit.

Eighth Embodiment

An eighth embodiment will now be described. An environmental sensor of another type according to an embodiment will be described.

FIGS. 10A to 10C are external views of an environmental sensor unit 10 according to an embodiment. The environmental sensor unit 10 uses a USB sensor. FIG. 10A is a side view of the environmental sensor unit 10 viewed from the distal end of a USB connector 10d. FIG. 10B is a front view of the environmental sensor unit 10 viewed from its front surface 10a. FIG. 10O is a side view of the environmental sensor unit 10 viewed from its one side surface 10c. The body of the environmental sensor unit 10 according to an embodiment includes a rectangular parallelepiped casing 10e, which is substantially square when viewed from the front surface 10a, and is substantially rectangular when viewed from the side surface 10c. The components shown in FIG. 1 (excluding the external power supply 6) are contained in the casing 10e.

The environmental sensor unit 10, which includes the USB connector 10d, allows the obtained data to be either transmitted using the communication module 2 communicable with a remote controller, or to be directly provided to a remote controller, such as a personal computer, using the USB connector 10d. The environmental sensor unit 10 can be powered from an external power supply (a USB connector mounted device) through the USB connector 10d. The environmental sensor unit 10 may also operate on a battery (not shown) contained in the casing 10e. The environmental sensor unit 10 also has its front surface 10a having a lighting window 10b for collecting visible light and UV light. The lighting window 10b is formed from a material that transmits visible light and UV light. The intensity of the visible light passing through the lighting window 10b is detected by the illuminance sensor 4b, and the intensity of the UV light passing through the lighting window 10b is detected by the UV sensor 4c. This enables measurement of the illuminance and the UV light.

The side surface 10c of the environmental sensor unit 10 has vents 10f, which allow the outside air to flow into the environmental sensor unit 10. The target physical quantities are measured by the temperature-humidity sensor 4a, the atmospheric pressure sensor 4d, the microphone 4f, and the $CO_2$ sensor 4g using the outside air around the environmental sensor unit 10 flowing through the vents 10f into the environmental sensor unit 10.

Figure 11:
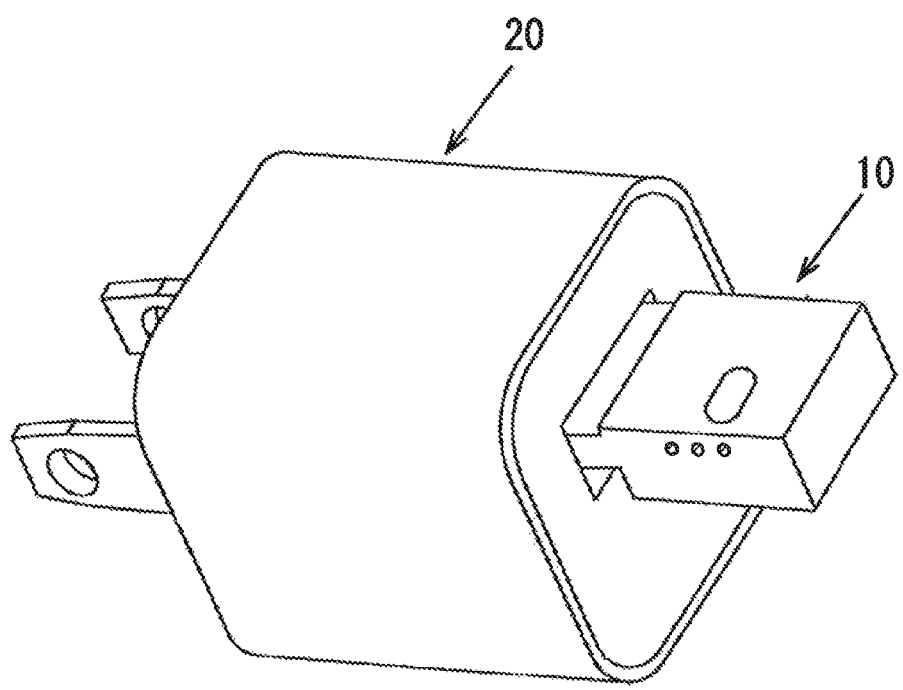
FIG. 11 is an external perspective view illustrating an environmental sensor unit and an outlet adapter according to an eighth embodiment.

FIG. 11 is a perspective view of the environmental sensor unit 10 connected to an outlet adapter 20. The environmental sensor unit 10 is provided with the outlet adapter 20. With the outlet adapter 20 inserted into a wall outlet at the installation location (e.g., in a room) in the state shown in FIG. 11, the environmental sensor unit 10 can be powered in a stable manner and also can be fixed at the installation location in a stable manner.

This type of environmental sensor unit 10 is fixed by being connected to the outlet adapter 20, which is inserted into a wall outlet at an installation location to continuously obtain environmental information at the location. When a user goes out, the user can remove the environmental sensor unit 10 from the outlet adapter 20 and use the unit as an exercise counter while carrying it in his or her pocket or bag. When the environmental sensor unit 10 is moved together with the outlet adapter 20 from its installation location to a different installation location, the environmental sensor unit 10 can continuously obtain environmental information or activity information while the unit is moved from the initial installation location to the new installation location.

The control procedures shown in first to seventh embodiments may also be used with the environmental sensor unit 10. This structure increases the use mode variations of the environmental sensor unit 10 and enhances its convenience. The outlet adapter 20 in an embodiment is one example of a fixing unit. The environmental sensor unit 10 is one example of a movable unit.

In an embodiment, the outlet adapter 20 may include at least the illuminance sensor 4b. The outlet adapter 20 can continuously obtain environmental data about turning on or off of the light for the environmental sensor unit 10 installed at any location. The outlet adapter 20 may include a sensor for obtaining positional information (e.g., a global positioning system or a GPS). The obtained positional information may be stored in a memory included in the outlet adapter 20, or transmitted to and stored in a remote controller. The remoter controller can thus constantly detect and store information about the installation location at which the environmental sensor unit 10 is to be fixed. In this case, the outlet adapter 20 or the remote controller functions as a positional information storage unit.

In an embodiment, when the outlet adapter 20 is installed in every room, a room number for each room may be stored in the memory included in the outlet adapter 20, or may be transmitted to and stored in the remote controller. In this case as well, the outlet adapter 20 or the remote controller functions as a positional information storage unit.

In an embodiment, the environmental sensor unit 10 may integrally receive a key for a room in which the outlet adapter 20 is installed. For example, the environmental sensor unit 10 may be a key holder or the casing 10e may directly receive the blade of the key. The environmental sensor unit 10 including the casing 10e with no USB connector 10d may also be used as a key holder to hold the key integrally, or the casing 10e may directly receive one end of the key integrally (in this case, the casing 10e may function as a connector). This structure allows a person using the room to inevitably carry the environmental sensor unit 10 when going out, and allows the environmental sensor unit 10 while being moved to obtain activity data in a more reliable manner.

Ninth Embodiment

A ninth embodiment will now be described. An environmental sensor of still another type according to an embodiment will be described.

Figure 12:
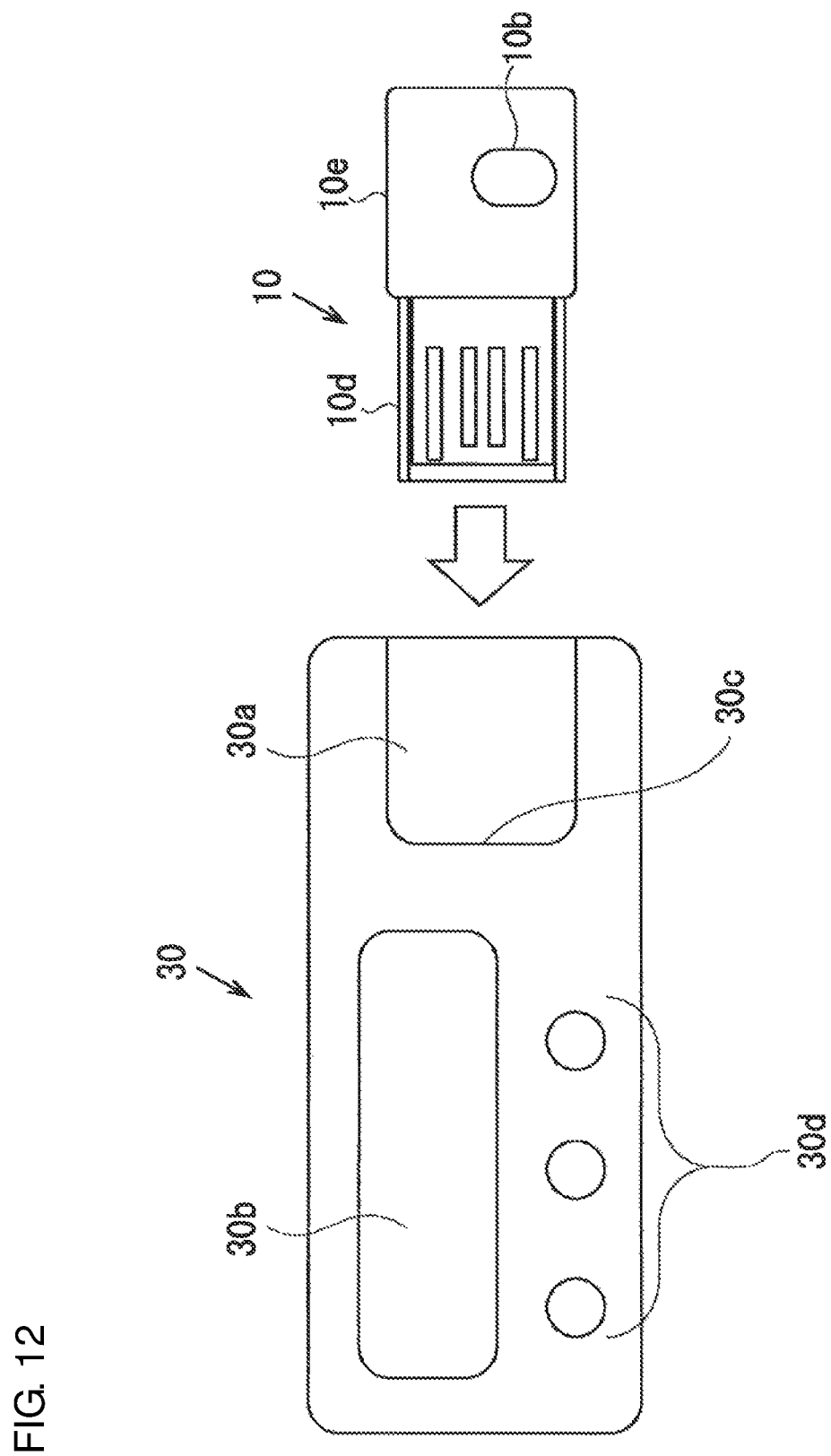
FIG. 12 is an external view illustrating an environmental sensor unit and an exercise counter unit according to a ninth embodiment.

FIG. 12 is an external view of the environmental sensor unit 10 and an exercise counter unit 30 according to an embodiment. The environmental sensor unit 10 in an embodiment is equivalent to the environmental sensor unit 10 described in an eighth embodiment. In an embodiment, the environmental sensor unit 10 is connected to the outlet adapter 20 as shown in FIG. 11 to obtain environmental information continuously when fixed at its installation location. When the environmental sensor unit 10 is to be moved away, the environmental sensor unit 10 may be connected to the separate exercise counter unit 30 to function as an exercise counter.

More specifically, the exercise counter unit 30 includes a display 30b for displaying obtained data or setting information, an operation unit 30d for allowing a user to select a measurement mode or a display mode, and a power supply (not shown). The environmental sensor unit 10 includes a USB connector 30c for connection to the USB connector 10d, and a housing 30a for receiving the casing 10e when the USB connector 10d is connected to the USB connector 30c.

As described above, the control procedures shown in first to seventh embodiments may be used with the system including the environmental sensor unit 10, the outlet adapter 20, and the exercise counter unit 30. This allows the environmental sensor unit 10 to obtain environmental information more appropriately at its installation location while the environmental sensor unit 10 is connected to the outlet adapter 20, as well as to obtain activity information more appropriately while the environmental sensor unit 10 is connected to the exercise counter unit 30 and is being moved. In an embodiment, the outlet adapter 20 functions as the fixing unit, the exercise counter unit 30 functions as a second movable unit, and the environmental sensor unit 10 functions as a sensor element unit.

The use mode may be switched between when the environmental sensor unit is fixed at the installation location and when the sensor unit is being moved away from the installation location and is being moved in any manner other than those described above. For example, all the sensor elements may be turned on when the environmental sensor unit is fixed at the installation location, whereas all the sensor elements may be turned off when the environmental sensor unit is away from the installation location and is being moved. This allows the environmental sensor unit to obtain environmental information only when the sensor unit is fixed.

In some embodiments, the environmental sensor unit may store no measurement data from the sensor elements being on while the environmental sensor unit is away from the installation location and is being moved. This control is performed when, for example, a user carrying the environmental sensor unit demonstrates measurement of data using the environmental sensor unit to his or her friend. For example, the user may have a dedicated application temporarily installed onto his or her friend's smartphone to communicate with the environmental sensor unit to display environmental measurement data on the smartphone. In this case, the environmental sensor unit may avoid storing the obtained values as data for the original user.

When the user returning home forgets to replace the environmental sensor unit onto the installation location and instead leaves the sensor unit in his or her bag, the environmental sensor unit may alert the user by informing that the environmental sensor unit is neither fixed at the installation location and is nor away from the installation location and is being moved.

When the environmental sensor unit is connected to the outlet adapter and fixed, the outlet adapter may include a sensor for obtaining positional information. This enables continuous measurement of the information at the installation location when the environmental sensor unit is replaced by another unit.

Although the processor in the MCU 3 performs the moving detection routines 1 to 7 in embodiments described above, an external remote controller may also perform the moving detection routines 1 to 7. In this case, the communication module 2 may simply transmit a control signal for each sensor element to the environmental sensor unit. In this modification, a CPU included in the remote controller functions as the state determination unit and the operation switching unit.

In the above embodiments, turning off the sensor elements includes switching the sensors having a sleep mode to the sleep mode, in addition to entirely stopping supplying power to these sensor elements. Turning off the sensor elements further includes simply stopping obtaining data from the sensor elements, while the sensors are maintained to be powered.

REFERENCE SIGNS LIST

1, 10 environmental sensor unit
2 communication module
3 MCU
4a to 4g sensor
5 flash memory
6 external power supply
7 battery
20 outlet adapter
30 exercise counter unit

The invention claimed is:

1. An environmental sensor for measuring a plurality of physical quantities associated with a surrounding environment, the environmental sensor comprising:
a plurality of sensor elements; and
a processor configured with a program to perform operations comprising operation as a state determination unit configured to determine whether the environmental sensor is in a first state in which the environmental sensor is fixed at a predetermined installation location or in a second state in which the environmental sensor is away from the predetermined installation location based on at least one physical quantity of the plurality of physical quantities measured by a sensor element of the plurality of sensor elements, wherein
the processor is configured with the program to perform operations such that operation as the state determination unit comprises operation as the state determination unit that determines that the environmental sensor is in the second state in response to the at least one physical quantity measured by the sensor element of the plurality of sensor elements being greater than or equal to a threshold for a predetermined duration.

2. The environmental sensor according to claim 1, wherein the processor is configured with the program to perform operations further comprising:
operation as an operation switch unit configured to switch an operation of each of the plurality of sensor elements configured to measure the plurality of physical quantities based on whether a state determined by the state determination unit is the first state or the second state.

3. The environmental sensor according to claim 2, wherein
the processor is configured with the program to perform operations such that operation as the operation switch unit comprises operation as the operation switch unit that stops at least one of the sensor elements in the second state.

4. The environmental sensor according to claim 2, wherein
the plurality of sensor elements comprises an acceleration sensor element configured to measure an acceleration applied to the environmental sensor, and
the processor is configured with the program to perform operations such that operation as the operation switch unit comprises operation as the operation switch unit that stops the acceleration sensor element in the first state, and activates the acceleration sensor element in the second state.

5. The environmental sensor according to claim 2, wherein
the sensor elements comprise an acceleration sensor element configured to measure an acceleration applied to the environmental sensor, and
the processor is configured with the program to perform operations such that operation as the operation switch unit comprises operation as the operation switch unit that causes the acceleration sensor element to obtain data at shorter intervals in the second state than in the first state.

6. The environmental sensor according to claim 2, wherein
the sensor elements comprise an acceleration sensor element configured to measure an acceleration applied to the environmental sensor, and
the processor is configured with the program to perform operations such that operation as the state determination unit comprises operation as the state determination unit that determines whether the environmental sensor is in the first state or in the second state based on the acceleration measured by the acceleration sensor element.

7. The environmental sensor according to claim 1, wherein
the plurality of sensor elements comprises an acceleration sensor element configured to measure an acceleration applied to the environmental sensor, and the processor is configured with the program to perform operations such that operation as the state determination unit comprises operation as the state determination unit that determines whether the environmental sensor is in the first state or in the second state based on the acceleration measured by the acceleration sensor element.

8. The environmental sensor according to claim 7, wherein
the sensor elements comprise an atmospheric pressure sensor element configured to measure an atmospheric pressure around the environmental sensor, and
the processor is configured with the program to perform operations such that:
operation as the state determination unit comprises operation as the state determination unit that determines a vertical position of the environmental sensor based on the atmospheric pressure measured by the atmospheric pressure sensor element, and
operation as the state determination unit comprises operation as the state determination unit that determines that the environmental sensor is in the first state in response to the determined vertical position of the environmental sensor indicating a value representing a vertical position of the predetermined installation location, and determines that the environmental sensor is in the second state in response to the determined vertical position of the environmental sensor deviating from the value representing the vertical position of the predetermined installation location.

9. The environmental sensor according to claim 7, wherein
the sensor elements comprise an illuminance sensor element configured to measure an illuminance of light incident on the environmental sensor, and
the processor is configured with the program to perform operations such that operation as the state determination unit comprises operation as the state determination unit that determines whether the environmental sensor is in the first state or in the second state based on the illuminance measured by the illuminance sensor element.

10. The environmental sensor according to claim 1, wherein
the plurality of sensor elements comprises an atmospheric pressure sensor element configured to measure an atmospheric pressure around the environmental sensor, and
the processor is configured with the program to perform operations such that operation as the state determination unit comprises operation as the state determination unit that determines a vertical position of the environmental sensor based on the atmospheric pressure measured by the atmospheric pressure sensor element, and the state determination unit determines that the environmental sensor is in the first state in response to the determined vertical position of the environmental sensor indicating a value representing a vertical position of the predetermined installation location, and determines that the environmental sensor is in the second state in response to the determined vertical position of the environmental sensor deviating from the value representing the vertical position of the predetermined installation location.

11. The environmental sensor according to claim 1, wherein
the plurality of sensor elements comprises an illuminance sensor element configured to measure an illuminance of light incident on the environmental sensor, and
the processor is configured with the program to perform operations such that operation as the state determination unit comprises operation as the state determination unit that determines whether the environmental sensor is in the first state or in the second state based on the illuminance measured by the illuminance sensor element.

12. The environmental sensor according to claim 1, further comprising:
a connector electrically connectable to a mobile device,
wherein the processor is configured with the program to perform operations such that operation as the state determination unit comprises operation as the state determination unit that determines that the environmental sensor is in the second state in response to the state determination unit detecting that the environmental sensor is connected to the mobile device through the connector.

13. The environmental sensor according to claim 1, wherein
the environmental sensor alerts a user in response to the state determination unit determining that the environmental sensor is in a state other than both the first state and the second state.

14. The environmental sensor according to claim 1, further comprising:
an outlet adapter fixable at the predetermined installation location, wherein
the environmental sensor is fixable to the outlet adapter in the first state, and is removable from the outlet adapter in the second state,
the sensor elements comprise an illuminance sensor element configured to measure an illuminance of light incident on the environmental sensor, and
the illuminance sensor element among the sensor elements is placed in the outlet adapter.

15. The environmental sensor according to claim 1, further comprising:
an outlet adapter fixable at the predetermined installation location, wherein
the environmental sensor is fixable to the outlet adapter in the first state, and is removable from the outlet adapter in the second state, and
the outlet adapter comprises a positional information storage unit configured to store positional information for the outlet adapter.

16. The environmental sensor according to claim 1, further comprising:
an outlet adapter fixable at the predetermined installation location; and
the environmental sensor is fixable to the outlet adapter in the first state, and is removable from the outlet adapter in the second state,
wherein the environmental sensor is configured to receive a key for a space comprising the predetermined installation location.

17. The environmental sensor according to claim 1, further comprising:
an outlet adapter fixable at the predetermined installation location;
an exercise counter; and
the environmental sensor is fixable to the outlet adapter in the first state, and is fixable to the exercise counter in the second state, wherein at least one of the sensor elements is placed in the environmental sensor.

* * * * *